United States Patent
Calderbank et al.

[11] Patent Number: 5,960,041
[45] Date of Patent: Sep. 28, 1999

[54] METHOD AND APPARATUS FOR GENERATING HIGH RATE CODES FOR RECORDING INFORMATION ON A MAGNETIC MEDIUM

[75] Inventors: Arthur Robert Calderbank, Princeton, N.J.; Ehud Alexander Gelblum, New York, N.Y.

[73] Assignee: Lucent Technologies Inc., Murray Hill, N.J.

[21] Appl. No.: 08/531,805

[22] Filed: Sep. 21, 1995

[51] Int. Cl.[6] .............................. H04L 25/34; H04L 25/49
[52] U.S. Cl. .............................. 375/292; 341/57; 341/58; 371/43
[58] Field of Search .................................. 375/286, 292, 375/261, 262, 263, 264, 340, 341, 346, 348, 349, 350, 234; 341/57, 58, 106; 371/43.1, 37.01; 360/40

[56] References Cited

U.S. PATENT DOCUMENTS

| | | | |
|---|---|---|---|
| 4,183,066 | 1/1980 | Anderson | 360/40 |
| 4,486,740 | 12/1984 | Seidel | 341/58 |
| 4,864,421 | 9/1989 | Morioka et al. | 358/334 |
| 4,882,638 | 11/1989 | Onishi et al. | 360/32 |
| 4,941,154 | 7/1990 | Wei | 375/261 |
| 4,979,052 | 12/1990 | Matsuta et al. | 360/40 |
| 5,029,185 | 7/1991 | Wei | 371/43 |
| 5,056,112 | 10/1991 | Wei | 371/43 |
| 5,088,113 | 2/1992 | Wei | 371/37.1 |
| 5,095,392 | 3/1992 | Shimazaki et al. | 360/40 |
| 5,105,442 | 4/1992 | Wei | 375/261 |
| 5,115,453 | 5/1992 | Calderbank et al. | 375/261 |
| 5,136,436 | 8/1992 | Kahlman | 341/57 |
| 5,144,304 | 9/1992 | McMahon et al. | 341/58 |
| 5,195,107 | 3/1993 | Wei | 375/340 |
| 5,214,656 | 5/1993 | Chung et al. | 371/43 |
| 5,216,694 | 6/1993 | Wei | 375/261 |
| 5,243,629 | 9/1993 | Wei | 371/43 |
| 5,258,987 | 11/1993 | Wei | 371/43 |
| 5,270,714 | 12/1993 | Tanaka et al. | 341/57 |
| 5,276,708 | 1/1994 | Heitmann | 341/58 |
| 5,301,209 | 4/1994 | Wei | 375/261 |
| 5,311,547 | 5/1994 | Wei | 341/106 |
| 5,329,551 | 7/1994 | Wei | 375/261 |
| 5,341,134 | 8/1994 | Benjauthrit | 341/58 |
| 5,349,349 | 9/1994 | Shimizume | 341/58 |
| 5,365,232 | 11/1994 | Ido et al. | 341/58 |
| 5,451,943 | 9/1995 | Satomura | 341/58 |
| 5,608,397 | 3/1997 | Soljanin | 341/58 |

OTHER PUBLICATIONS

Calderbank, A.R., and Ozarow, L.H., "Nonequiprobable Signaling on the Gaussian Channel," IEEE Transactions on Information Theory, vol. 36, No. 4, Jul. 1990, pp. 726–740.

*Primary Examiner*—Chi H. Pham
*Assistant Examiner*—Bryan Webster

[57] ABSTRACT

Method and apparatus for encoding digital information to be recorded on a magnetic medium is disclosed. The invention provides for receiving a sequence of ($2^m n+d$) user bits, mapping the sequence of user bits to $2^m$ dc-free codewords, and recording the $2^m$ dc-free codewords on a magnetic medium. A modulation coder, which includes a memory containing multiple non-intersecting subconstellations of dc-free codewords, performs the mapping in a non-equiprobable manner such that a particular codeword from a larger subconstellation is more likely to be used than a particular codeword from a smaller constellation. Less desirable codewords, such as those containing relatively long strings of bits having the same value, are assigned to the smaller subconstellations, thereby lessening the likelihood of loss of timing and gain parameters in the system, as well as maximizing the transmission rate and efficient use of the set of possible dc-free sequences of a given length.

43 Claims, 9 Drawing Sheets

| SUBCONSTELLATION | RELATIVE SIZE | ACTUAL PROBABILITY |
|---|---|---|
| $\Omega_{00}$ | $\frac{128}{240}=0.53$ | 0.66 |
| $\Omega_{01}$ | $\frac{64}{240}=0.27$ | 0.22 |
| $\Omega_{10}$ | $\frac{32}{240}=0.13$ | 0.09 |
| $\Omega_{11}$ | $\frac{16}{240}=0.07$ | 0.03 |

METHOD AND APPARATUS FOR GENERATING HIGH RATE CODES FOR RECORDING INFORMATION ON A MAGNETIC MEDIUM

CROSS-REFERENCE TO RELATED APPLICATIONS

This application is related to U.S. patent application Ser. No. 08/515,445, entitled "Method and Apparatus for Generating DC-Free Sequences," which was filed on Aug. 15, 1995 and which is commonly assigned to the assignee of the present invention.

FIELD OF THE INVENTION

The present invention relates generally to the field of coding for digital systems, and, in particular, improved methods and apparatus for generating high rate codes that are dc-free and suitable for recording information on a magnetic medium.

BACKGROUND OF THE INVENTION

Information, such as signals representing voice data, video or text, must typically be processed before the information can be transmitted over a communications channel or recorded on a medium. First, the information, if not already in digital form, is digitized, for example by an analog-to-digital converter. Next, the digital information may be "compressed" to represent the information by a fewer number of bits. Any savings due to compression are, however, partially offset by processing the compressed information using error correcting codes. Error correcting codes introduce additional bits to a signal to form an encoded signal. The additional bits improve the ability of a system to recover the signal when the encoded signal has been corrupted by noise introduced by a communications channel or by a recording medium.

A further type of coding used in transmission and recording systems is modulation coding. As with error correcting codes, modulation coding can improve a system's immunity to noise. Modulation codes also can advantageously be used to regulate timing and gain parameters in recording and communications systems.

For example, consider a system which reads information stored on a magnetic medium. In non-return-to-zero-inverse (NRZI) recording, for example, a binary "1" is recorded on a portion of the magnetic medium by causing a change in the magnetization or magnetic flux of that portion of the medium. A binary "0" is recorded by causing no change in magnetization. The bits are read by detecting a sequence of changes in a voltage signal caused by changes in the magnetization of portions of the medium. The voltage signal, however, may be corrupted by noise in the recording system. The voltage is typically a pulse each time a "1" is detected and just noise each time a "0" is detected. The position of the pulses is used to set timing parameters in the system, and the height of the pulses is used to set gain parameters in the system. If, however, a long string of zeros is read, there is no voltage output other than noise, and hence no timing or gain information, thereby leading to a loss of, or drift in, timing and gain parameters in the system.

Modulation coding thus may be used to ensure that the recording or transmission of a long string of binary zeros is avoided. Modulation coding may be implemented, for example, by dividing digital information that is to be recorded into sets of bits, called information words. Each information word is then used to select a codeword in a codebook. The codewords in the codebook are of length N bits where the codeword bits define a channel sequence, in other words, a sequence of symbols to be sent over a channel. For example, a binary "1" in a codeword may represent the symbol "−1" or negative magnetic flux, and a binary "0" in a codeword may represent the symbol "+1" or positive magnetic flux. If the codewords in the codebook do not contain a long string of zeros, then the selected codewords recorded on the medium will likewise not contain a long string of zeros, thereby obviating the timing and gain control problem.

Additionally, it is often desirable to use channel sequences that have a spectral null at zero (dc) frequency by which it is meant that the power spectral density function of the channel sequence at dc equals zero. Such sequences are said to be dc-free. One way to assure a dc-free sequence is to design a system in which the block digital sum, or the arithmetic sum, of symbols in a codeword transmitted over a channel is zero. However, efficient or high-rate modulation codes that can prevent long strings of zeros from occurring without adding an excessive number of redundant bits to the information to be recorded, and that are dc-free typically require both codewords and codebooks of larger sizes as discussed further below.

It is known that the power spectral density function of a channel sequence x, where $x = \ldots x_{-1}, x_0, x_1, \ldots$, vanishes at zero frequency if and only if its running-digital-sum (RDS), defined as $$RDS_i = \sum_{j=-\infty}^{i} x_j$$

is bounded. It is also known, for example, how to translate sequences of symbols from the symbol alphabet of the error-correcting code symbols into channel sequences with bounded RDS's by means of dc-free modulation codes which may be finite-state codes or block codes. Block codes, for example, take blocks of M symbols, called information words, and map them into blocks of N channel symbols or sequences called codewords. Several factors favor the use of block codes. One such factor is limited error propagation since the symbols used to encode one block are not used in encoding any other block and thus errors in encoding are typically confined to a particular block. Another factor is ease of implementation. One way to organize the mapping of information words to codewords is to form a codebook or look-up table of $2^M$ codewords and use an M-bit input word to specify or address an N-bit codeword in the codebook. The ratio M/N defines the rate R of the modulation code.

To ensure that an arbitrary sequence of codewords has a bounded RDS, each codeword $w = w_0, w_1, \ldots W_N$ is required to have a block digital sum (BDS), defined as $$BDS = \sum_{j=0}^{N} w_j$$

equal to zero. Codewords of bipolar symbols, for example, +1 and −1, and having a BDS equal to zero, are possible only if the codeword length N is even and if half the symbols are −1 and half the symbols are +1. The number of such codewords is then equal to $$\binom{N}{N/2},$$

where $$\binom{N}{N/2} = \frac{(N)(N-1)\cdots(N-N/2+1)}{(N/2)(N/2-1)\cdots(1)}.$$

However, at most $2^M$ codewords having a BDS equal to zero can be used to form a codebook for an M/N rate code, where M=floor $$\left[\log_2\binom{N}{N/2}\right]$$

and where the function floor[x] returns the largest integer less than or equal to x. The code rate R=M/N indicates that for every M information bits, N channel bits are generated, with N≧M.

The above explanation is rendered more clear by use of a specific example. Consider a sequence having a block length N equal to 4. There are 16 possible sequences, 6 of which are dc-free. By using a block length of four bits, however, the value of M equals 2, and two of the dc-free codewords will not be used in the codebook. In some cases, the requirement that M=floor $$\left[\log_2\binom{N}{N/2}\right]$$

causes a substantial number of extra dc-free sequences not to be used. For example, if N=8, the number of dc-free sequences is 70, but the codebook is of size 64 and thus 6 dc-free sequences are not used. Similarly, if N=10, there are 252 possible dc-free sequences. The codebook, however, is of size 128. Thus, 124 sequences are discarded thereby lowering the code rate from approximately 0.8 to 0.7.

Furthermore, in magnetic recording applications, it is desirable that modulation codes have rates higher than 3/4 so that more information can be written on the recording medium. Codes having a relatively long block length are required for rates above 3/4. Also, large codebooks are required where the codewords in the codebooks are dc-free. For example, a code of rate 11/14 requires a block length of 14 and a codebook size of 2048, and a code of rate 13/16 requires a block length of 16 and a codebook of size 8192. Such large codebooks, however, typically require the implementation of more complex circuitry and often require large power consumption and large area on integrated circuits relative to other elements in the transmission or recording system. Also, the larger the codebook, the more time it takes to access codewords in the codebook. Although some techniques have been proposed to reduce the size of the codebooks, these techniques add additional complexity and do not substantially reduce the size of the codebooks. Thus, there is a need for a method and apparatus for generating high rate codes that are dc-free and suitable for recording information on a magnetic medium.

SUMMARY OF THE INVENTION

The present invention addresses the aforementioned problems by providing a novel method and apparatus for encoding digital information to be recorded on a magnetic medium. The method preferably includes the steps of receiving a sequence of ($2^m$n+d) user bits and mapping the sequence of user bits to $2^m$ dc-free codewords. In particular, the method preferably includes selecting $2^m$ dc-free codewords from among a plurality of non-intersecting subconstellations of dc-free codewords of a particular length, wherein the step of selecting comprises the step of identifying from which of the plurality of subconstellations each of the $2^m$ dc-free codewords will be selected by using a portion of the sequence of user bits in a predetermined order and the step of specifying the $2^m$ dc-free codewords based upon the remaining user bits in the sequence. The selected $2^m$ dc-free codewords may then be recorded on a magnetic medium.

A modulation coder, which preferably includes a codebook comprising the plurality of non-intersecting subconstellations of dc-free codewords, performs the mapping in a non-equiprobable manner such that a particular codeword from a larger subconstellation is more likely to be used than a particular codeword from a smaller constellation. In particular, codewords with more bit transitions or more frequent bit transitions preferably are assigned to subconstellations different from codewords with fewer or less frequent bit transitions. Specifically, codewords with a relatively high number of bit transitions are preferably assigned to the larger subconstellations, whereas codewords with a relatively low number of bit transitions are preferably assigned to the smaller subconstellations, thereby lessening the loss of timing and gain parameters in the magnetic recording system, as well as improving the transmission rate and efficient use of the set of possible dc-free sequences of a given length.

The present invention also provides a method and apparatus for decoding information stored on a magnetic medium. A more complete understanding of the present invention, as well as other features and advantages of the present invention, may be obtained with reference to the following detailed description and accompanying drawings.

DETAILED DESCRIPTION OF THE INVENTION

Figure 1:
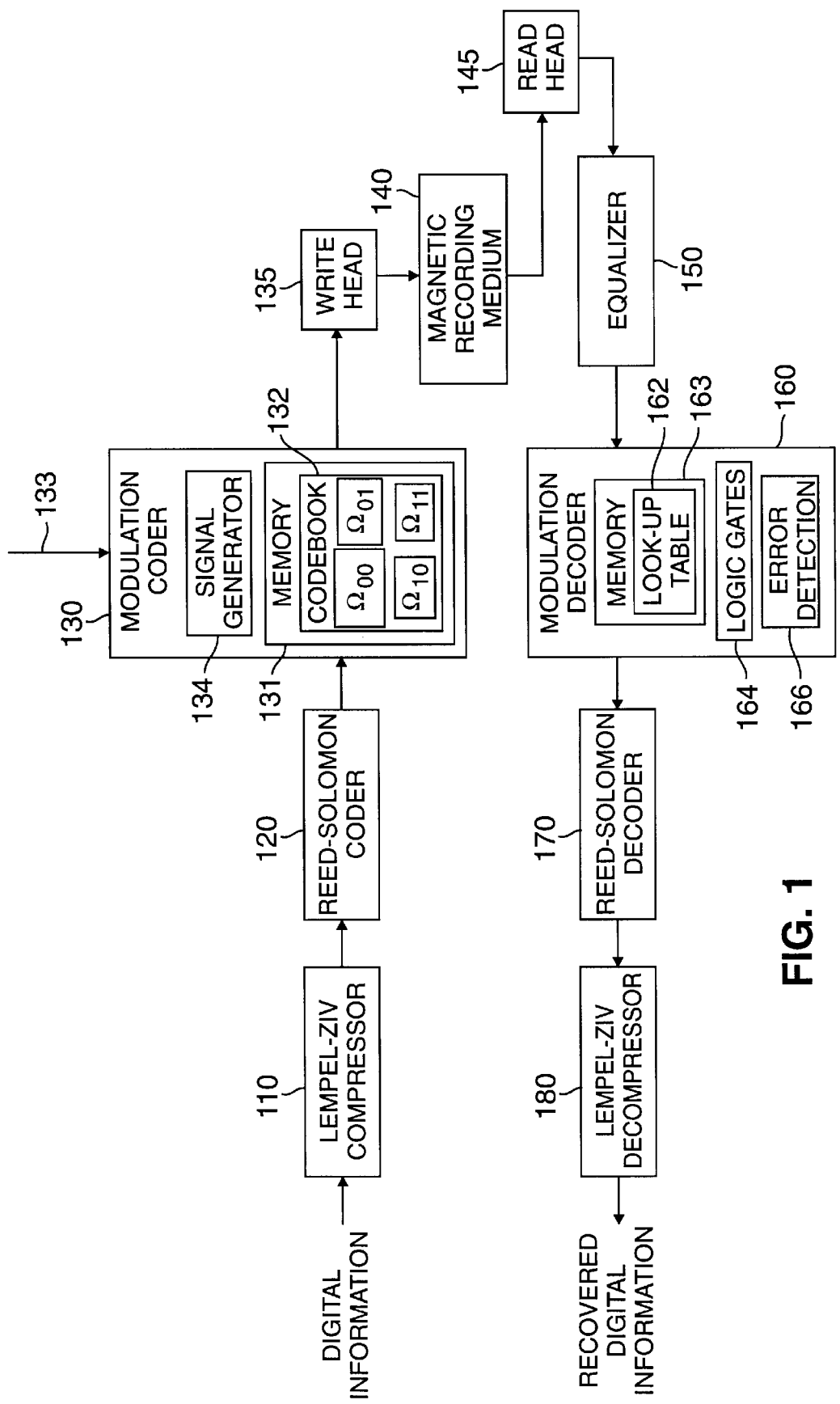
FIG. 1 is a block diagram of an exemplary system in which the invention may be practiced.

FIG. 1 is a block diagram of an exemplary system in which the invention may suitably be practiced. The system of FIG. 1 is particularly useful for recording digital information on and reading digital information from a magnetic medium such as those employed in digital audio tapes on disk drives.

The information to be recorded preferably is first "compressed" using a Lempel-Ziv compressor 110 so as to reduce the amount of information that must be recorded on the medium thereby saving time and money. Next, the compressed information preferably is sent as an input to an encoder 120 which encodes the compressed information using Reed-Solomon codes. The purpose of Reed-Solomon encoding is to adjoin extra symbols to the compressed information so that noise introduced in the reading process will not cause errors when the information is received. Lempel-Ziv and Reed-Solomon encoding are described in greater detail in Timothy C. Bell at al., Text Compression, Prentice-Hall, Englewood Cliffs, N.J., 1990 and S. Lin and D. J. Costello, Error Control Coding, Prentice-Hall, Englewood Cliffs, N.J., 1983, respectively, which are incorporated herein by reference. Other coding techniques which provide the same effect may suitably be employed.

The output of the encoder 120 is a series of symbols where each symbol is represented by a set of bits. The symbols are sent as an input to a modulation coder 130 which is designed to map each of the input symbols into a dc-free sequence or codeword having a predetermined number of bits. The modulation coder 130 may be implemented using a processor designed or programmed to perform the functions explained below. In particular, the modulation coder 130 may conveniently be implemented, for example, by a microprocessor programmed with appropriate firmware. For example, an 80C51 microprocessor manufactured by the Philips Semiconductors company, may suitably be used to implement the coder 130. Alternatively, the modulation coder 130 may be suitably implemented by a general purpose processor or in a specially designed semiconductor chip or other dedicated hardware. In any event, the dc-free sequences or codewords are then transmitted from the modulation coder 130 to a write head 135 and recorded on a magnetic medium 140, such as digital audio tapes on a disk drive.

Signals representing the information recorded on the magnetic medium 140 may then be read by a read head 145 and preferably sent to an equalizer 150 which controls intersymbol interference. Output signals from the equalizer are then sent to a modulation decoder 160, a Reed-Solomon decoder 170 and a Lempel-Ziv decompressor 180, respectively, so as to recover the information recorded on the magnetic medium 140.

Figure 2:
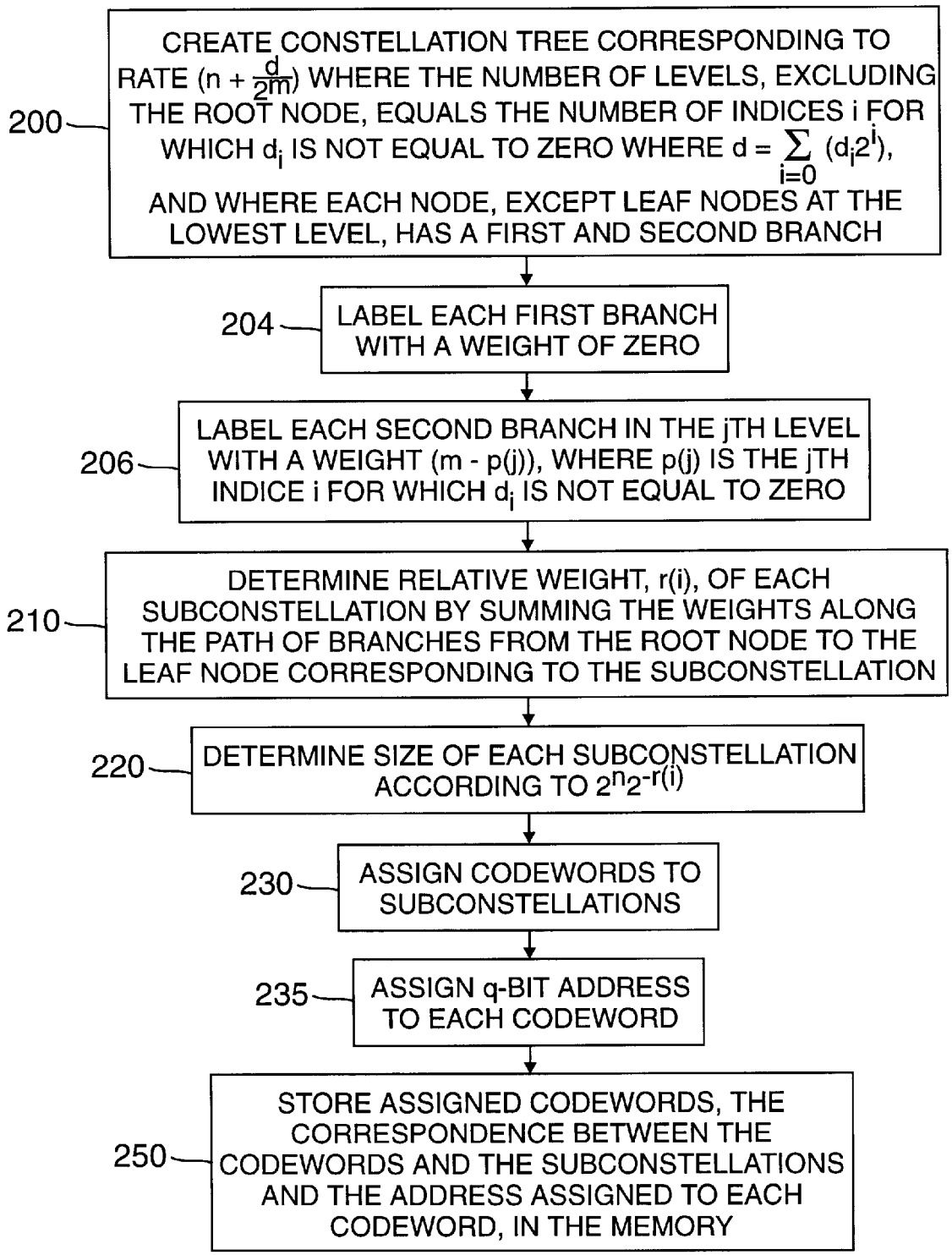
FIG. 2 is a flow chart showing the steps for designing a modulation coder with a codebook according to the principles of the present invention.

FIG. 2 is a flow chart showing the steps for programming or designing the modulation coder 130 with a codebook for use in mapping a sequence of bits using a specified rate. First, as indicated by step 200, a constellation tree is created corresponding to the desired average rate, where the average rate $\beta$ has the form $\beta=(n+d/2^m)$ bits per codeword, where $2^m$ is the dimensionality of the code, n is a positive integer, and d is a positive integer less than $2^m$. A generalized cross constellation is a set of non-intersecting subconstellations of channel sequences or codewords from which N-dimensional dc-free channel sequences are drawn. Each subconstellation is a subset of the entire constellation of channel sequences or codewords. The relative sizes of the subconstellations determine both the rate of the encoder and the dimensionality of the code. A specific code is thus uniquely defined.

Figure 3A:
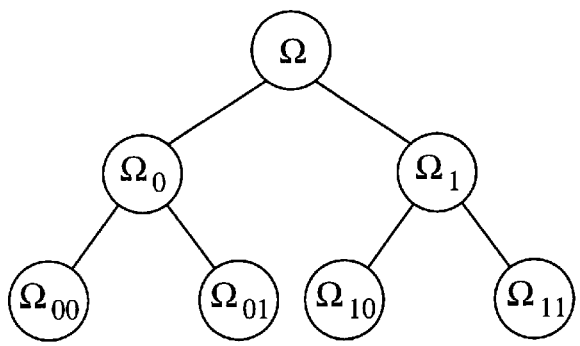
FIGS. 3A–3C illustrate the creation of an exemplary constellation tree according to the principles of the present invention.

The constellation tree comprises a root node and at least one additional level of nodes, including leaf nodes at the lowest level of the constellation tree. Each node, except the leaf nodes, has first and second branches such that each subsequent level of nodes has twice as many nodes as the previous level. This is illustrated, for example, in FIG. 3A. The root node represents the entire constellation $\Omega$, whereas the subconstellations $\Omega_{00}$, $\Omega_{01}$, $\Omega_{10}$, $\Omega_{11}$, are represented in FIG. 3A by the leaf nodes at the lowest level of the constellation tree.

In order to aid in understanding the present invention, it will be helpful to use a particular example. Consider, for example, a rate of (7+3/4). Using this rate, n=7, d=3, and m=2. Next, consider the binary expansion of $$d = \sum_{i=0} (d_i 2^i).$$

The number of levels in the constellation tree, excluding the root node, is w, where w equals the number of indices i for which $d_i$ is not equal to zero. Using the example indicated above, $d=3=2^0+2^1$. Thus, in the example, w equals 2, as shown in FIG. 3A.

Figure 3B:
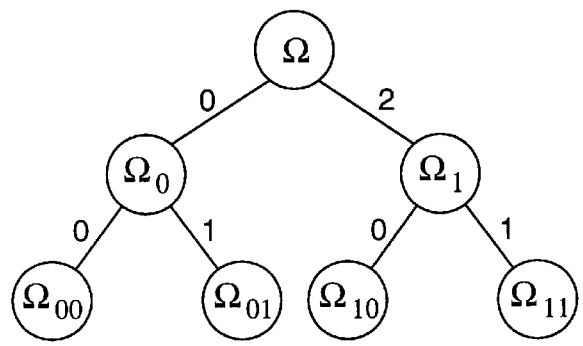

Next, the branches of the constellation tree are labelled with a weight as explained below. Let $p(0)<p(1)<. . . <p(w-1)$ be the members of the set P which represents the ordering of indices i for which $d_i$ is not equal to zero. Again, using the above example, $P=\{0,1\}$, with $p(0)=0$, and $p(1)=1$. As indicated by step 204, the first branch of each node, or each of the left-going branches of the constellation tree, are labelled with a weight of zero. Next, as indicated by step 206, the second branch of each node, or each of the right-going branches, are labelled with the weight $(m-p(j))$, where j is the level of the tree and $p(j)$ is defined as above. FIG. 3B illustrates the resulting constellation tree and relative weights of the branches for the above example.

Figure 3C:
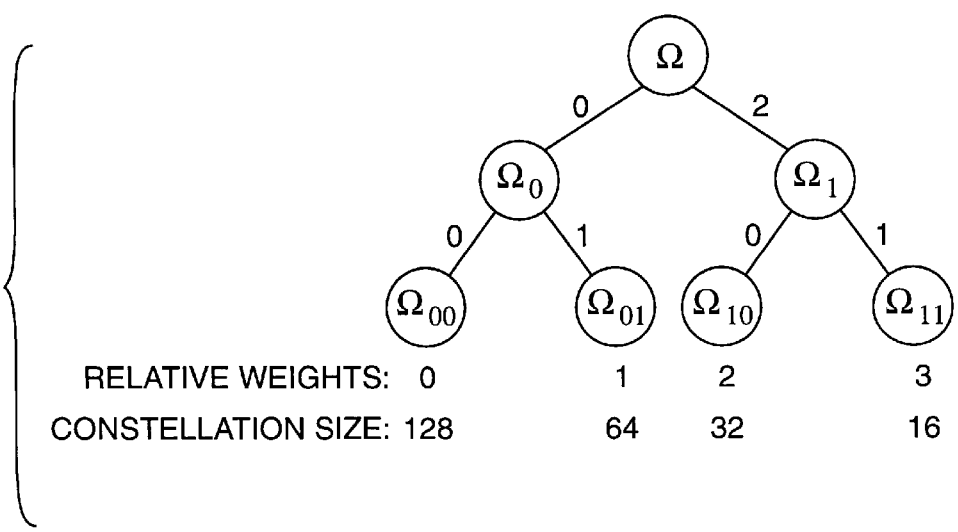

Once the constellation tree is created, the relative weight $r(i)$ of each subconstellation is determined, as indicated in step 210. To determine the relative weight of a particular subconstellation represented by one of the leaf nodes, the sum of the weights along the path commencing from the root node and terminating with the particular leaf node is calculated. The relative weights corresponding to the above example are indicated in FIG. 3C.

The size or number of entries of each subconstellation may be determined in step 220 from the relative weights according to the formula $(2^n \times 2^{-r(i)})$. Thus, as indicated by FIG. 3C, the subconstellation $\Omega_{00}$ in the above example has a constellation size of 128, the subconstellation $\Omega_{01}$ has a size of 64, the subconstellation $\Omega_{10}$ has a size of 32, and the subconstellation $\Omega_{11}$ has a size of 16. The total constellation $\Omega$, in this example, therefore, contains 240 codewords. It will be noted that the sizes of the subconstellations are different from one another. In addition, the number of bits or length of the codewords is preferably chosen to be the minimum length N, where $$\binom{N}{N/2}$$

is greater than or equal to the total number of codewords in the constellation $\Omega$. Thus, in the above example, each of the 240 dc-free codewords preferably has a length of ten bits.

As indicated by step 230, the codewords are then assigned to the subconstellations. Since, as explained above, there are 252 possible 10-bit dc-free channel sequences, a decision must be made as to which twelve of the 252 possible dc-free channel sequences will be discarded. Furthermore, a decision must be made as to how the remaining 240 codewords will be divided among and assigned to the subconstellations, $\Omega_{00}$, $\Omega_{01}$, $\Omega_{10}$, $\Omega_{11}$.

Figures 2A, 4:
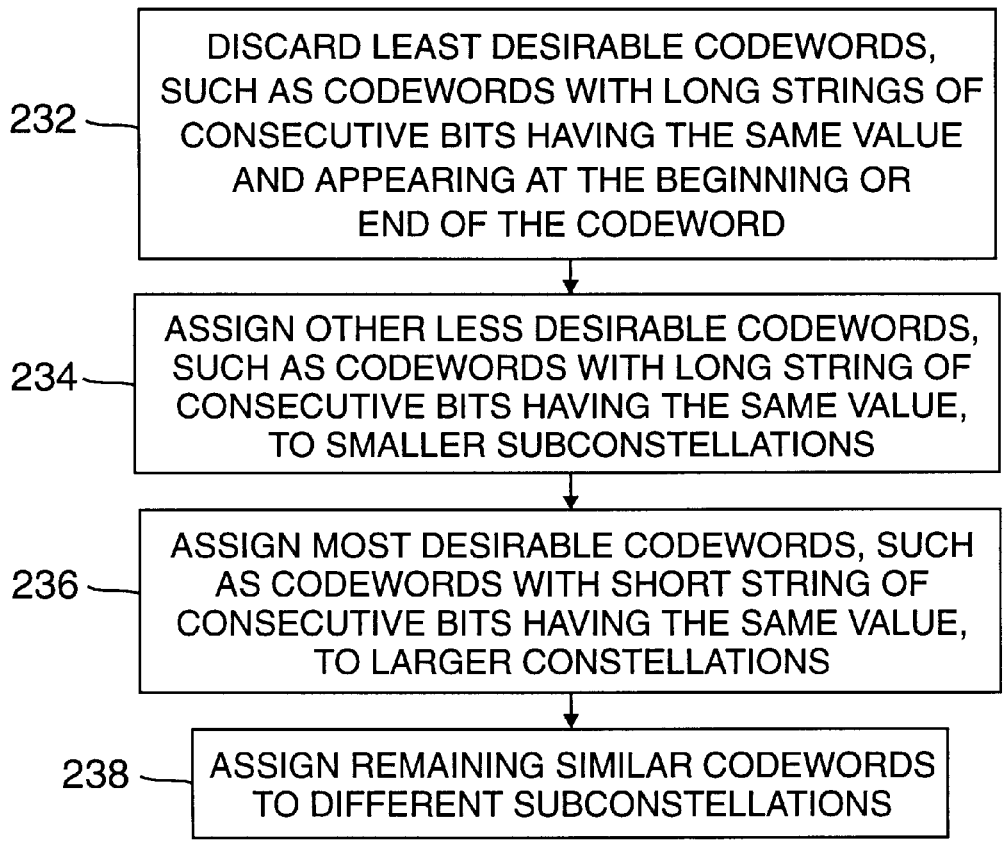
FIG. 2A ia a flow chart showing the steps for assigning codewords to subconstellations in the codebook in accordance with the present invention.
FIG. 4 is a table showing the relative sizes and the actual probabilities of utilization which result from using the encoding algorithm of the present invention with respect to an exemplary set of four subconstellations.

It will be evident from the encoding algorithm discussed below that the various subconstellations are not utilized in proportion to their relative sizes. For example, FIG. 4 is a table showing the relative sizes and the actual probabilities of utilization which result from using the mapping technique discussed below for the four subconstellations discussed above. While channel sequences or codewords from a particular subconstellation are selected with equal probability, the encoding algorithm discussed below favors channel sequences or codewords from the larger constellations at the expense of the smaller constellations. This non-equiprobable feature allows the less desirable dc-free sequences to be assigned to the smaller subconstellations, thereby decreasing the likelihood that they will be utilized during the coding process. Conversely, the more desirable dc-free sequences may be assigned to the larger subconstellations, thereby increasing the likelihood that they will be utilized during the coding process.

In certain communication systems using, for example, voiceband data transmission or fading channels, an important concern is the elimination of high energy symbols. In the magnetic recording context, however, eliminating high energy symbols is not an important issue because each bit in a channel sequence or codeword represents either a positive or negative magnetic flux of +1 or −1, respectively. Rather, as discussed above, a desirable feature for a magnetic recording system is the ability to generate high rate codes that are dc-free and that obviate the timing and gain problems which result from long strings of consecutive bits having the same value.

As indicated in step 232 of FIG. 2A, in a presently preferred embodiment, dc-free channel sequences that include a relatively long string of consecutive bits having the same value, and, in particular those channel sequences wherein the string of consecutive bits which have the same value appears at the beginning or at the end of the sequence, are discarded. Thus, for example, the channel sequences 1111100000 and 0000011111 would be discarded. Also, as indicated by step 234, other channel sequences containing relatively long strings of consecutive bits having the same value are preferably assigned to the smaller subconstellations. For example, the channel sequences 0001111100 and 1110000011 would be assigned to the subconstellation $\Omega_{11}$. Conversely, as shown in step 236, channel sequences that do not contain a relatively long string of consecutive bits having the same value are preferably assigned to the larger subconstellations. The channel sequences 1010101010 and 0101010101 would, therefore, be assigned to the subconstellation $\Omega_{00}$. In general, codewords with fewer bit transitions are preferably assigned to the smaller subconstellations, whereas codewords with more bit transitions are preferably assigned to the larger subconstellations.

Finally, as indicated by step 238, with respect to the remaining channel sequences, those codewords which are similar to one another are preferably assigned to different subconstellations, whenever possible. For example, channel sequences which are identical except for two bits which are interchanged would preferably be assigned to different subconstellations.

Assigning the possible dc-free channel sequences to the subconstellations in the above manner helps reduce the loss of timing and gain parameters in the system. It also reduces the likelihood of errors occurring in the transmission, recording and identification of the channel sequences. This is because, as a result of the assignment process for assigning codewords to the subconstellations according to the present invention, codewords with frequent bit transitions inherently have fewer nearest neighbors. Codewords with fewer nearest neighbors allow fewer errors to propagate into later stages of decoding.

As indicated in step 235, each codeword in a particular one of the subconstellations is also assigned a q-bit address, where q is the minimum number of bits required to address all the codewords in the particular subconstellation. Specifically, for a subconstellation of size Q, each address is of length q, where $q=\log_2 Q$. Once the codewords are assigned to the subconstellations, the codewords are preferably stored in a codebook 132 in the modulation coder 130, as indicated by step 250. The codebook 132 may be advantageously implemented in memory 131 such as read only memory or random access memory. The correspondence between the codewords and the subconstellations, as well as the addresses assigned to each codeword, also are stored in the memory 131. Although the embodiment shown in FIG. 1 includes a single codebook which incorporates all of the subconstellations, it should be understood that the various subconstellations may be stored in a plurality of codebooks. Thus, for example, each subconstellation may be stored in a separate codebook.

The determination of the number and size of the subconstellations, as well as the assignment of the dc-free codewords to the subconstellations, may be performed by a person designing the modulation coder 130. In that situation, the codewords, the correspondence between the codewords and subconstellations, and the address assigned to each codeword, are stored in the memory 131 when the modulation coder 130 is designed. In an alternative embodiment of the present invention, the modulation coder 130 is programmed to perform the steps 200 through 239 in FIG. 2, as well as the steps 232 through 238 in FIG. 2A, in response to receiving a signal indicating the desired rate β. For this purpose, the modulation coder 130 preferably has at least one input lead 133 for receiving the values of n, m and d. The values n, m and d, or their equivalents, may be entered into the coder 130 by a user of the system employing, for example, a keyboard. The modulation coder 130 would then perform the steps 200 through 239 in FIG. 2, as well as the steps 232 through 238 in FIG. 2A. The assigned codewords, the correspondence between the codewords and the subconstellations, and the address of each codeword, would then be stored in the memory 131.

The discussion that follows describes how the modulation coder 130 is further designed or programmed to map a sequence of $2^m\beta=(2^m n+d)$ user bits received from the output of the Reed-Solomon coder 120 to $2^m$ dc-free channel sequences or codewords stored in the codebook 132. Returning to the example used earlier in which a rate of (7+3/4) bits per codeword was considered, m is equal to two, resulting in four channel sequences or codewords and a total of thirty-one user bits. Thus, the modulation coder 130 maps the thirty-one user bits into four 10-bit dc-free channel sequences or codewords. The four as-yet unspecified codewords conveniently may be labelled $A_0$, $A_1$, $A_2$ and $A_3$.

Figure 5:
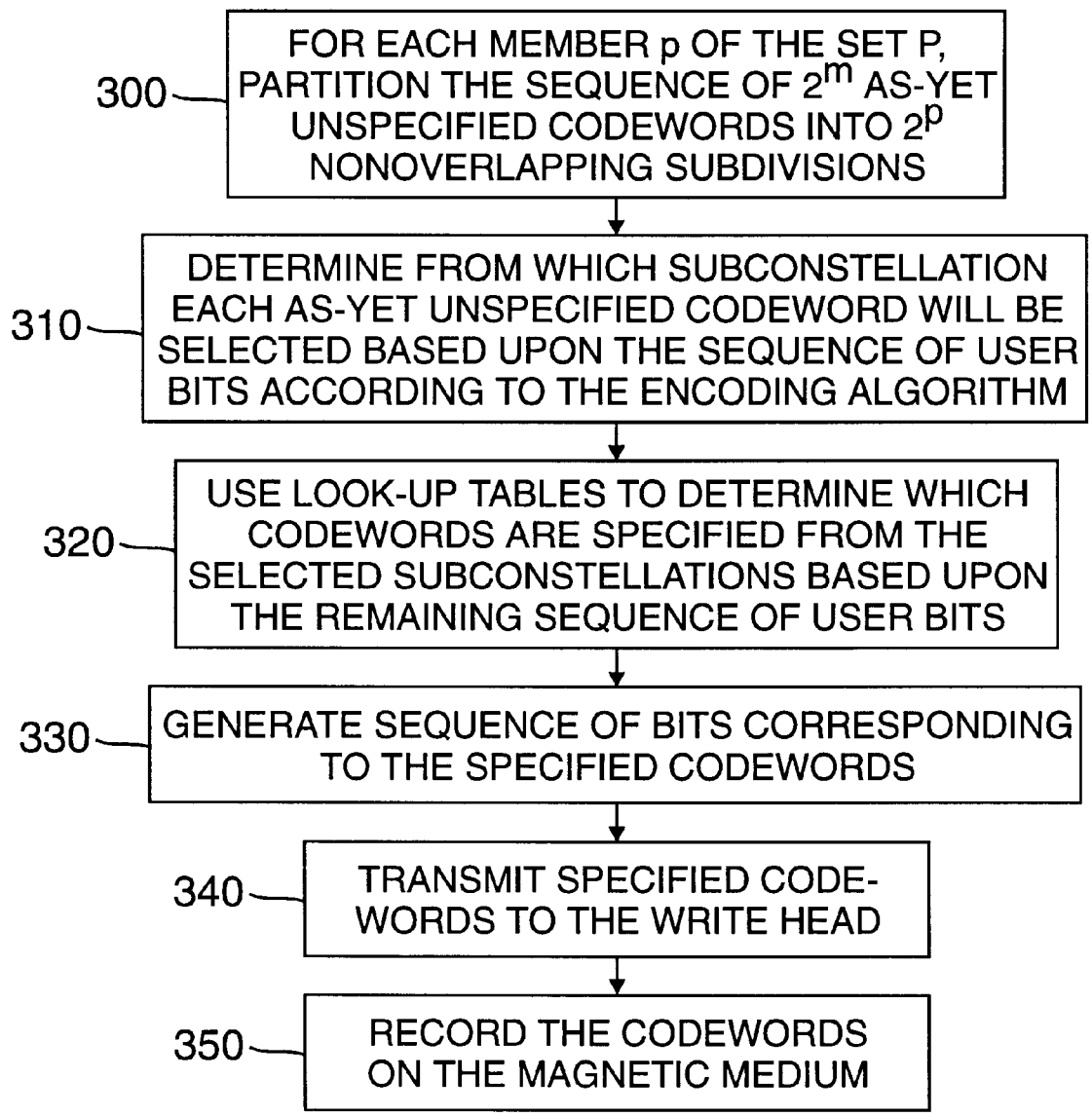
FIG. 5 is a flow chart showing the steps used in mapping user bits to codewords according to the present invention.

FIG. 5 is a flow chart showing the steps used in mapping the user bits to the codewords. In general, the modulation coder 130 utilizes a particular sequence of user bits to determine from which subconstellation the codewords will be selected and to identify the particular codewords which will be sent to the magnetic medium 140 and recorded thereon. More particularly, as explained in greater detail below, the modulation coder 130 preferably is designed to perform steps 300 through 340 in FIG. 5, as well as steps 311 through 318 in FIG. 5A.

As indicated by step 300, a partitioning technique is performed as follows. For each of the members of the set P defined above, the entire sequence of the as-yet unspecified $2^m$ codewords, $A_0 \ldots A_{2m-1}$, is partitioned into $2^p$ non-overlapping subdivisions $T_{p,i}$ where $0 \leq i < 2^p$. Again, referring to the example discussed above, P={0,1}. Thus, for p=0, there will be one subdivision $T_{0,0}$ which includes all four of the as-yet unspecified codewords, $A_0, A_1, A_2$ and $A_3$. Similarly, for p=1, there will be two subdivisions, $T_{1,0}$ and $T_{1,1}$, each of which includes two of the four as-yet unspecified codewords. The partitioned subdivisions need not be contiguous sets of codewords and are disjoint for different p. Thus, for the purposes of illustration, the subdivision $T_{1,0}$ will include the as-yet unspecified codewords $A_0$ and $A_3$, and the subdivision $T_{1,1}$ will include the as-yet unspecified codewords $A_1$ and $A_2$.

Next, as indicated by step 310, the sequence of user bits that are received at the input to the modulation coder 130 are used to determine and identify which of the subconstellations each of the as-yet unspecified codewords comes from, according to an encoding algorithm, described further below with respect to FIG. 5A. The encoding algorithm may be viewed as "walking" each of the as-yet unspecified codewords down the constellation tree until each one is associated with one of the leaf nodes in the lowest level of the constellation tree.

Figure 5A:
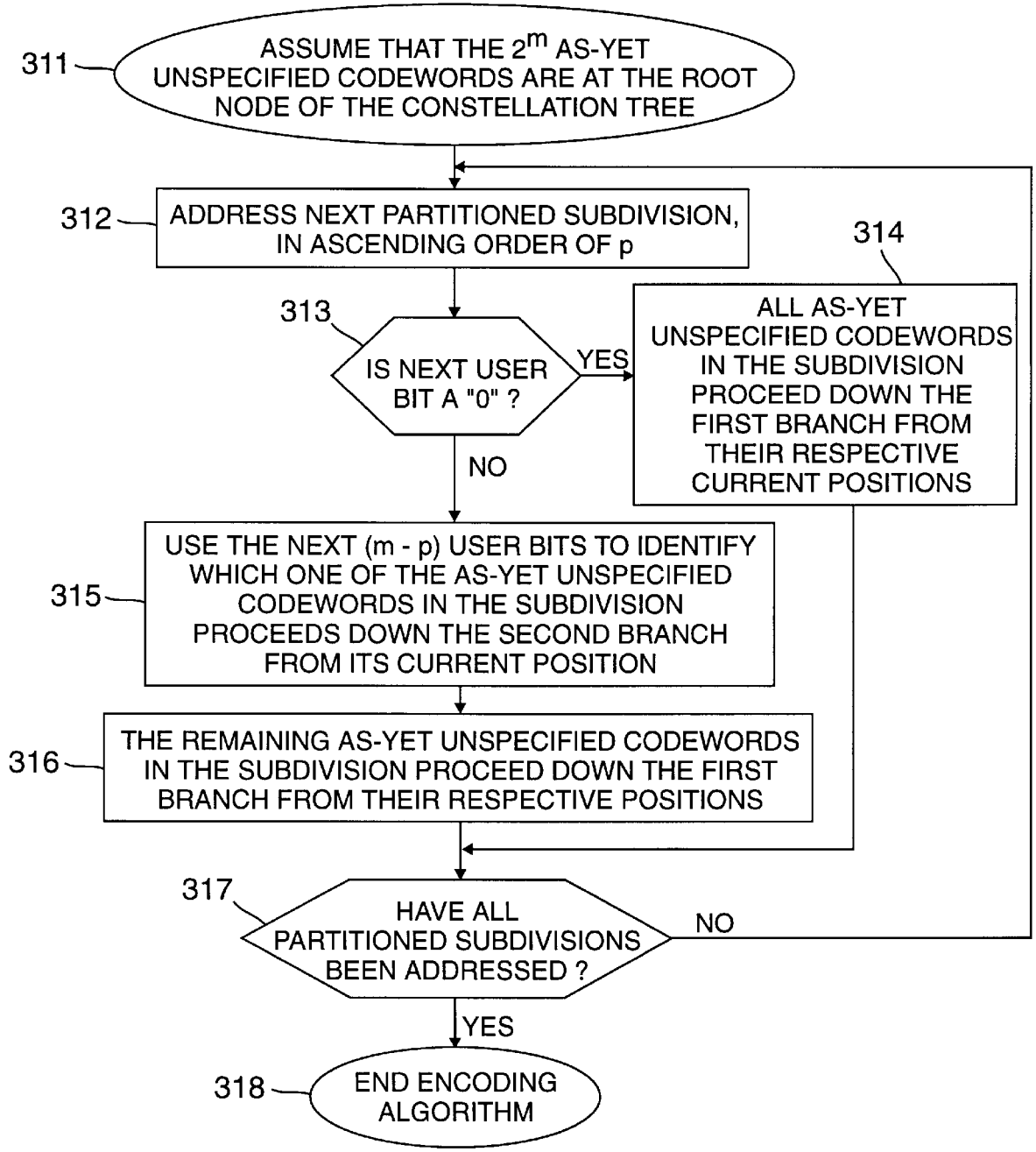
FIG. 5A is a flow chart showing the steps of the encoding algorithm in accordance with the present invention.

As indicated by 311 in FIG. 5A, one assumes that the $2^m$ as-yet unspecified codewords are at the root of the constellation tree. As shown in step 312, each of the partitioned subdivisions $T_{p,i}$ is addressed, in ascending order of p, by using a portion of the user bits in a predetermined order. Preferably, the user bits are used in sequential order. Next, as indicated by step 313, for each partitioned subdivision, the next user bit in the sequence determines whether all of the as-yet unspecified codewords in that subdivision proceed down the constellation tree over the first, or left, branch from each of their respective current positions, or whether exactly one as-yet unspecified codeword proceeds down the second, or right, branch, while the remaining as-yet unspecified codewords proceed down the first, or left, branch. For example, as shown by steps 314 and 315, respectively, a user bit of value "0" would indicate that all the as-yet unspecified codewords in the particular subdivision proceed down the first, or left, branch, whereas a user bit of value "1" would indicate that exactly one as-yet unspecified codeword in the particular subdivision proceeds down the second, or right, branch, while the remaining as-yet unspecified codewords in the particular subdivision proceed down the first, or left, branch. In the latter situation, as shown in step 316, the next (m-p) user bits in the sequence are used to identify and determine which particular as-yet unspecified codeword proceeds down the second, or right, branch. This process is continued, as indicated by step 317, until all the partitioned subdivisions have been addressed. Once all the partitioned subdivisions have been addressed, the encoding algorithm of step 310 ends, as shown by 318.

It should be noted that, although in the above discussion, with respect to steps 204, 206, 314, 315 and 316, the first branch of each node has been associated with the left-going branch and the second branch has been associated with the right-going branch, the association of the respective first and second branches may be reversed if done consistently for all relevant branches.

Figure 6:
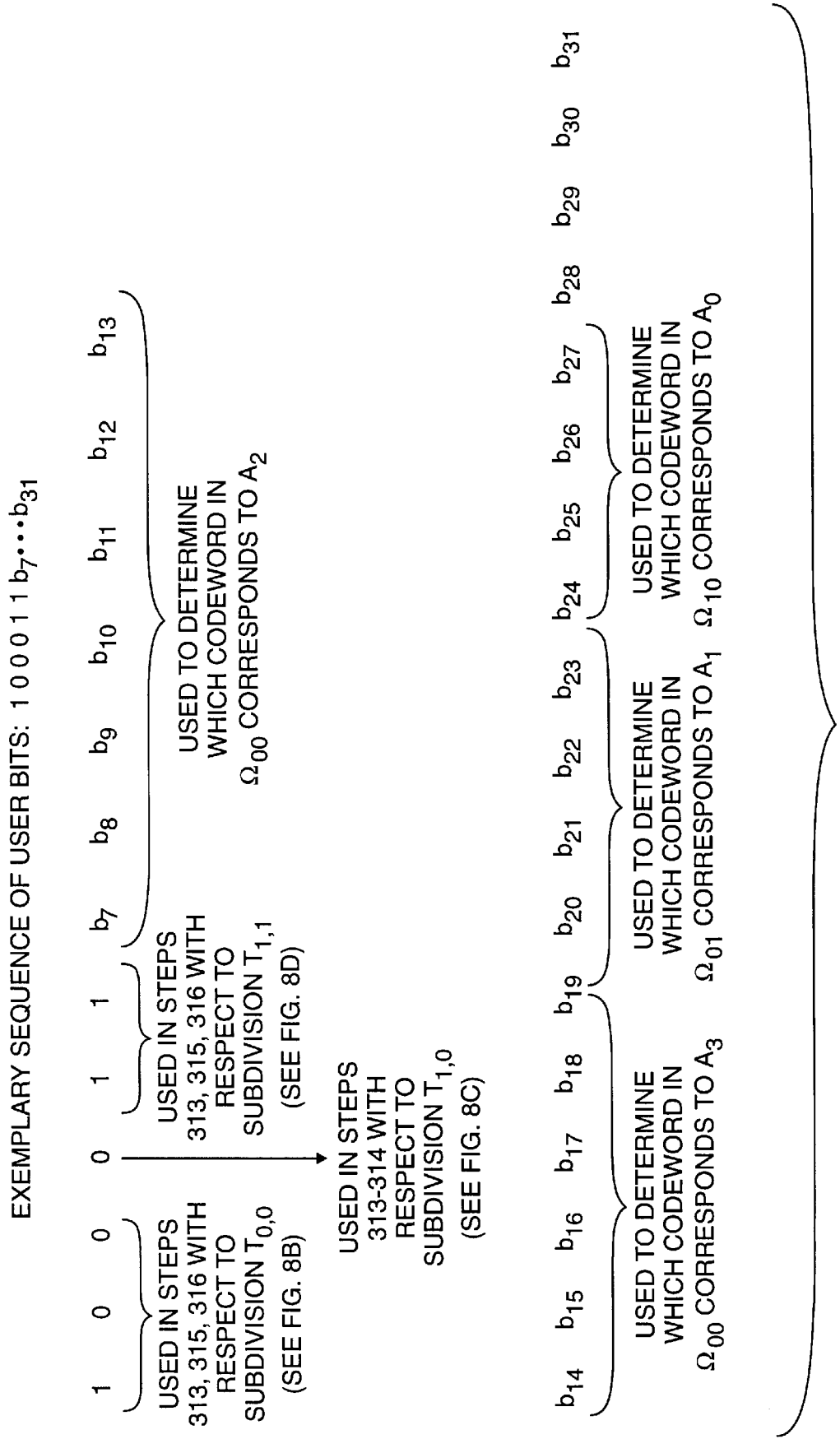
FIG. 6 and FIGS. 6A–6D illustrate an exemplary sequence of user bits and the application of the encoding algorithm of the present invention using the exemplary sequence of user bits.
Figure 6A:
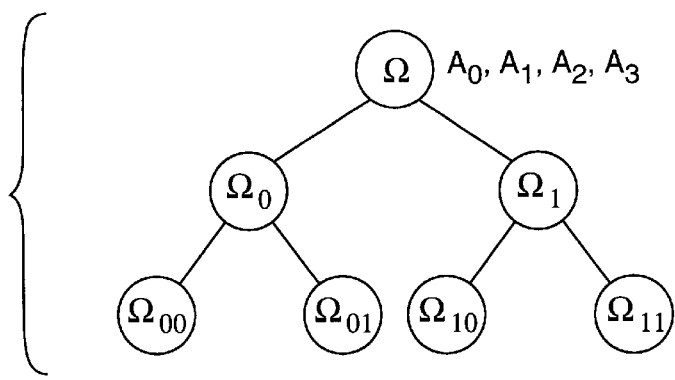
Figure 6B:
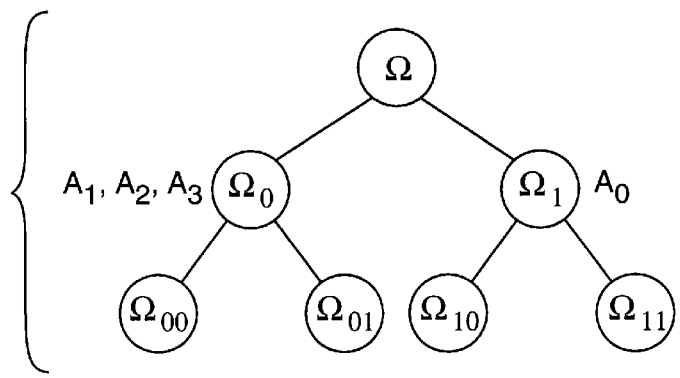

Referring again to the example discussed above, consider the exemplary sequence of thirty-one user bits 100011 . . . $b_{31}$ shown in FIG. 6. The four as-yet unspecified codewords, designated $A_0, A_1, A_2$ and $A_3$, are assumed to be sitting at the root node $\Omega$, as shown in FIG. 6A. The first user bit, whose value is "1", indicates that exactly one of the four codewords $A_0, A_1, A_2$ and $A_3$ in the subdivision $T_{0,0}$ proceeds down the right branch. The next two bits, which are both "0", are used to specify which one of the four codewords proceeds down the right branch. Again, for the purposes of illustration, $A_0$ is assumed to be the specified codeword that proceeds down the right branch. $A_1, A_2$ and $A_3$ thus proceed down the left branch. The result is shown in FIG. 6B.

Figure 6C:
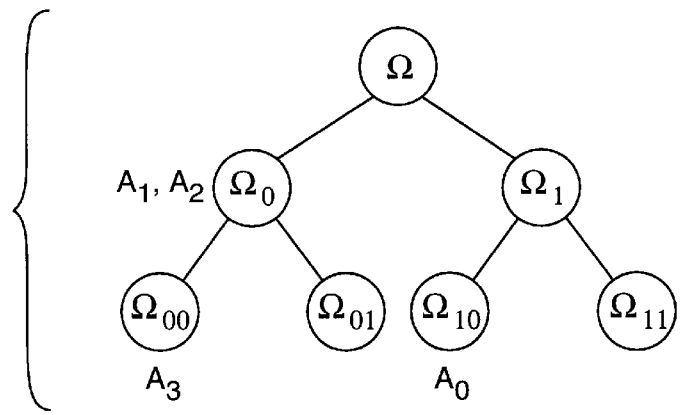
Figure 6D:
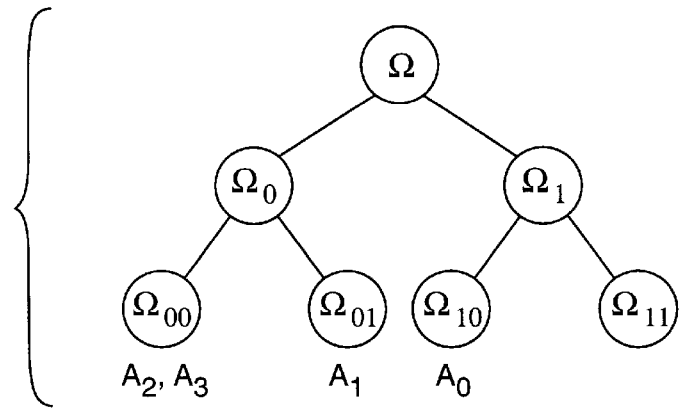

The next user bit, which is a "0", indicates that both codewords in the next subdivision, $T_{1,0}$ for example, proceed down the left branches from their current positions. This situation is shown in FIG. 6C. The fifth user bit, which is a "1", indicates that exactly one of the unspecified codewords in the next subdivision, $T_{1,1}$, proceeds down the right branch from its current branch. The next user bit, which is also a "1", is used to determine which of the two unspecified codewords, $A_1$ or $A_2$, proceeds down the right branch. For the purposes of illustration, it is assumed that $A_1$ is specified as the codeword which proceeds down the right branch from its current position. Thus, $A_2$ proceeds down the left branch from its current position. FIG. 6D shows the resulting situation.

In the example discussed above, and as shown in FIG. 6D, two of the as-yet unspecified codewords, $A_2$ and $A_3$, will be selected from among the codewords in the subconstellation $\Omega_{00}$. One of the as-yet unspecified codewords, $A_1$, will be selected from the codewords in the subconstellation $\Omega_{01}$, and the remaining as-yet unspecified codeword, $A_0$, will be selected from among the codewords in the subconstellation $\Omega_{10}$. In this particular example, none of the as-yet unspecified codewords will be selected from the codewords in the subconstellation $\Omega_{11}$.

As should be clear form the example discussed above, the determination of which subconstellation each of the as-yet unspecified codewords will be selected from requires use of fewer than all the bits in the sequence of user bits. As indicated by step 320 and as shown in FIG. 6, the remaining user bits are utilized to determine which specific channel sequences or codewords are specified. In fact, the remaining user bits are exactly sufficient to address all of the codewords in the selected subconstellations for each of the as-yet unspecified codewords. The addressing may be achieved, for example, by the use of look-up tables. As noted above, for a subconstellation of size Q, q bits are required to specify the address of a particular one of the codewords in that subconstellation, where q=$\log_2$Q.

In the example discussed above, six of the thirty-one user bits were required to determine from which of the four subconstellations, $\Omega_{00}, \Omega_{01}, \Omega_{10}$ and $\Omega_{11}$, each of the as-yet unspecified codewords, $A_0, A_1, A_2$ and $A_3$ will be selected. The remaining twenty-five user bits may be used to specify the addresses of the particular codewords within each of the selected subconstellations. Seven bits, for example bits $b_7$ through $b_{13}$, are required to determine which one of the 128 codewords in the subconstellation $\Omega_{00}$ will be used for $A_2$. Likewise, seven bits, for example $b_{14}$ through $b_{20}$, are required to determine which one of the 128 codewords in the subconstellation $\Omega_{00}$ will be used for $A_3$. Six user bits, for example $b_{21}$ through $b_{26}$, are required to determine which one of the 64 codewords in the subconstellation $\Omega_{01}$ will be used for $A_1$, and five user bits, for example $b_{27}$ through $b_{31}$, are required to determine which one of the 32 codewords in the subconstellation $\Omega_{10}$ will be used for $A_0$. In this manner, all thirty-one user bits received from the output of the Reed-Solomon coder 120 are used to map, and thereby encode, the thirty-one user bits to four 10-bit dc-free codewords obtained from the codebook 132.

Once the codewords that will be used for the encoding have been specified, the modulation coder 130 generates a sequence of bits corresponding to the selected $2^m$ dc-free codewords as indicated in step 330. A signal generating circuit or chip 134, for example, may be used to generate the bits corresponding to the selected codewords. Other suitable means may also be employed to generate the sequence of bits corresponding to the selected codewords. Then, as indicated by step 340, the coder 130 preferably transmits the specified codewords to the write head 135. Then, in step 350, the write head 135 records the specified codewords on the magnetic medium 140, preferably in a predetermined order, such as in the order corresponding to $A_0$, $A_1$, $A_2$ and $A_3$.

Figure 7:
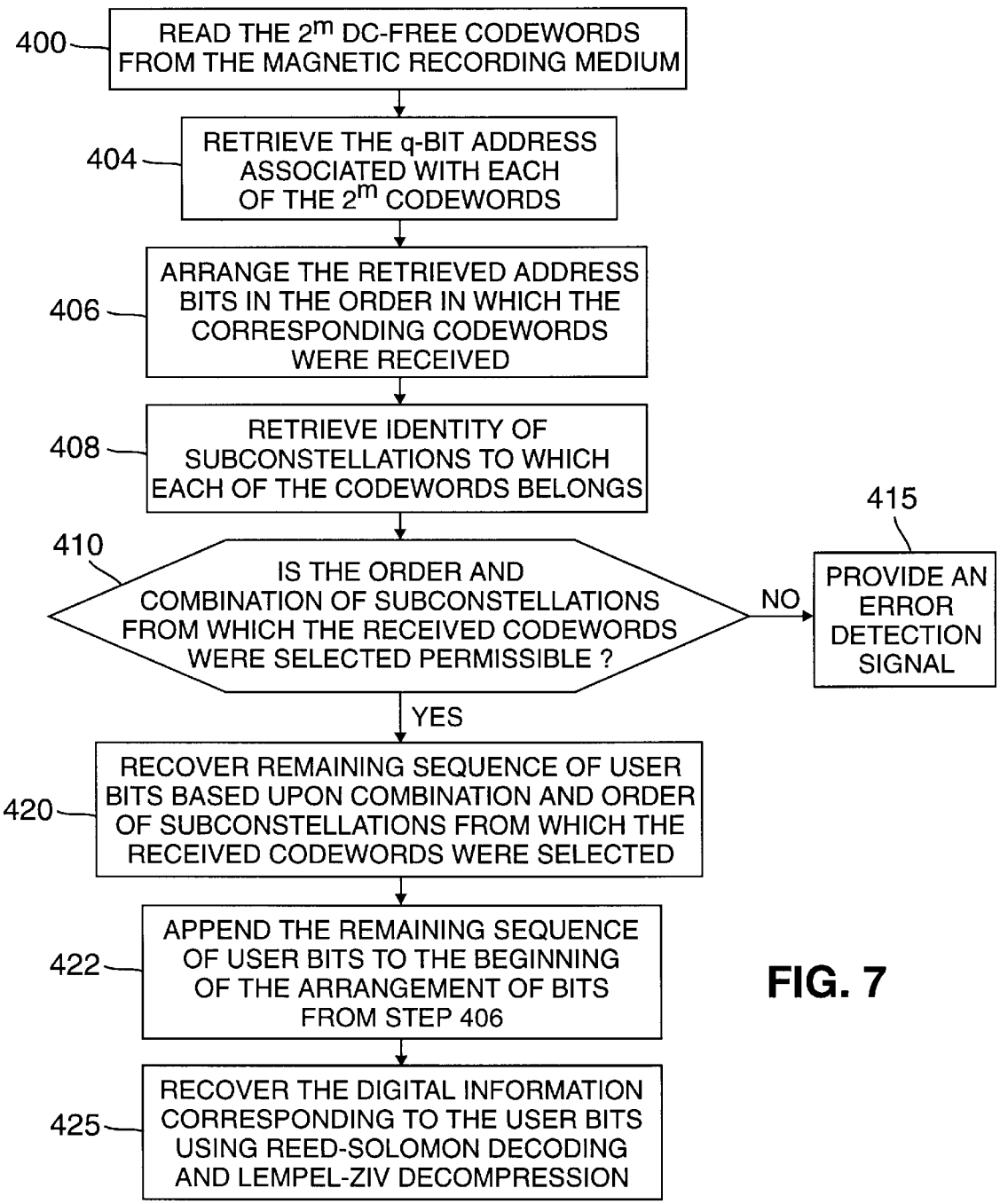
FIG. 7 is a flow chart showing the steps of recovering the digital information stored on a magnetic medium in accordance with the present invention.

At some later time, as indicated by step 400 in FIG. 7, the codewords recorded on the magnetic medium 140 are read by the read head 145 and preferably sent to the equalizer 150. The ($2^m n+d$) user bits are recovered, as explained further below, by the modulation decoder 160. The modulation decoder 160 may be implemented, for example, using a processor appropriately designed or programmed to perform the inverse of the functions performed by the modulation coder 130. The modulation decoder 160 thus allows the original ($2^m n+d$) user bits to be recovered and generated from the codewords that are read from the magnetic medium 140.

In one embodiment, the modulation decoder 160 has a look-up table 162 which is used by the modulation decoder 160 to perform the inverse of step 320 by mapping each codeword to its corresponding portion of the sequence of user bits. The look-up table 162, which may be stored in a memory 163 such as a read-only memory or a random access memory, includes each codeword in the codebook 132 and its corresponding q-bit address assigned to it in step 239. The memory 163 also stores the correspondence between each codeword and the identity of the subconstellation to which it belongs.

As indicated by step 404, the modulation decoder 160 retrieves the q-bit address associated with each of the $2^m$ codewords read from the magnetic recording medium 140. Using the exemplary sequence of user bits discussed above with respect to FIG. 6, the modulation decoder 160 would retrieve the address bits $b_7$ through $b_{13}$ corresponding to the codeword that was designated by $A_2$. Similarly, the modulation decoder 160 would retrieve the address bits $b_{14}$ through $b_{20}$, $b_{21}$ through $b_{26}$, and $b_{27}$ through $b_{31}$, corresponding, respectively, to the codewords that were designated by $A_3$, $A_1$ and $A_0$.

Next, as indicated by step 406, the modulation decoder 406 arranges the retrieved sets of address bits in the order in which the corresponding codewords were received. Again, with reference to the exemplary sequence of user bits discussed above, the modulation coder would arrange the bits $b_7$ through $b_{31}$ in sequential order, corresponding to the order of the received codewords $A_2$, $A_3$, $A_1$ and $A_0$.

The present invention also provides an added level of error detection. This added level of error detection is possible because the encoding algorithm discussed above with respect to FIG. 5A does not allow the $2^m$ codewords corresponding to a sequence of ($2^m n+d$) user bits to be selected from certain combinations of subconstellations. Thus, in the example discussed above, the four codewords may not all be selected from the subconstellation $\Omega_{11}$. In fact, in that particular example, no more than one of the as-yet unspecified codewords may be selected from the subconstellation $\Omega_{11}$. As indicated by step 408, the modulation decoder 160 retrieves from the memory 163 the identity of the subconstellations to which each of the $2^m$ received codewords belongs. Then, as indicated in 410, the modulation decoder 160 detects whether an impermissible combination of codewords has occurred. Thus, with reference to the example discussed above, the modulation decoder 160 preferably is programmed to detect the situation, for example, where two or more codewords are selected from the subconstellation $\Omega_{11}$. The modulation decoder 160 is also programmed to detect other impermissible combinations of codewords. As indicated by step 415, if such an error is detected, the modulation decoder 160 preferably provides an error detection alarm or signal on an error detection electronic circuit 166, for example.

If no error is detected, then as indicated by step 420, the modulation decoder 160 generates the remaining bits in the original sequence of user bits based upon the combination and order of subconstellations to which the $2^m$ received codewords belong. It will be recalled that, in step 310, a portion of the sequence of user bits was used to determine from which subconstellation each of the as-yet unspecified codewords would be selected. The modulation decoder 160 now uses the identity and order of the subconstellations to recover that portion of the sequence of user bits. For this purpose, the modulation decoder 160 preferably includes a plurality of logic gates 164 or other dedicated hardware. Signals representing the identity of the subconstellations to which the $2^m$ received codewords belong are sent as inputs to the logic gates 164. The logic gates 164 preferably are hardwired so that the output signals correspond to the remaining portion of bits in the original sequence of user bits.

Referring again to the example discussed above, the identity of the subconstellations retrieved in step 408 is $\Omega_{00}$, $\Omega_{00}$, $\Omega_{01}$, and $\Omega_{10}$. The output of the logic gates 164 would then be "100011" which represents the first six bits in the original sequence of user bits as shown in FIG. 6. As indicated by step 422, these remaining bits are appended to the beginning of the arrangement of bits that resulted from step 406. In this manner, the entire sequence of user bits is recovered from the $2^m$ codewords recorded on the magnetic medium 140.

Finally, as indicated by step 425, the digital information originally entered into the system may be recovered by sending signals representing the recovered sequence of user bits to the Reed-Solomon decoder 170. The output of the Reed-Solomon decoder 170 is then preferably sent to the Lempel-Ziv decompressor 180, the output of which corresponds to the digital information originally entered into the system.

The present invention thus provides several advantageous features. First, because the cross-constellation technique maps over multiple dimensions, it allows, a fractional number of bits to be mapped into each dc-free codeword. This allows greater flexibility in the selection of a desired rate. It also provides a non-equiprobable coding mechanism for favoring certain codewords over others. Specifically, for example, codewords that do not have relatively long strings of consecutive bits having the same value may be favored over those that do by assigning the favored codewords to the larger constellations. In this manner, the present invention provides an improvement for obviating the timing and gain problems previously associated with reading information stored on magnetic media.

Furthermore, for codewords having a specified length, the size of the codebook is larger than the size of the codebook that is realized by using previously known techniques such as the one described above in the background section. Thus, in the example discussed above, using dc-free codewords which have a length of ten bits results in a codebook containing 240 codewords. This compares with the codebook size of 128 codewords for 10-bit codewords using the known technique described above in the background section. As previously noted, larger codebooks allow higher rates to be achieved. The present invention, therefore, improves the transmission rate and efficiently uses the set of possible dc-free sequences of a given length for encoding and recording information on magnetic media. The efficiency of the mapping may be measured by the coefficient expansion ratio which equals the number of codewords divided by $2^\beta$. Thus, for the example discussed above, the coefficient expansion ratio equals $240/2^{7.75}$ or 1.12.

Although the present invention has been described with reference to specific embodiments, it will be appreciated that other arrangements within the spirit and scope of the present invention will be readily apparent to persons of ordinary skill in the art. The present invention is, therefore, limited only by the appended claims.

We claim:

1. A method of encoding digital information at an average rate of $(n+d/2^m)$ user bits per codeword, wherein n is a positive integer, and d is a positive integer less than $2^m$, the method comprising the steps of:

receiving a sequence of $(2^m n+d)$ user bits;

selecting $2^m$ dc-free codewords from among a plurality of non-intersecting subconstellations of dc-free codewords, wherein codewords with the most frequent bit transitions are assigned to subconstellations different from codewords with the least frequent bit transitions, wherein the step of selecting comprises the steps of:

identifying from which of the plurality of subconstellations each of the $2^m$ dc-free codewords will be selected based upon a portion of the sequence of user bits; and specifying the $2^m$ dc-free codewords based upon the remaining user bits in the sequence; and generating a sequence of bits corresponding to the selected $2^m$ dc-free codewords.

2. The method of claim 1 wherein codewords with the most frequent bit transitions are assigned to larger subconstellations and codewords with the fewest bit transitions are assigned to smaller subconstellations, wherein the step of identifying comprises executing an algorithm which uses the subconstellations in a non-equiprobable manner such that a particular codeword from a larger subconstellation is more likely to be used than a particular codeword from a smaller subconstellation.

3. The method of claim 2 wherein the step of selecting comprises selecting the codewords from at least one codebook wherein codewords with more bit transitions are assigned to larger subconstellations than codewords with fewer bit transitions.

4. The method of claim 2 wherein the number of subconstellations is determined by creating a constellation tree based at least upon the value of d, wherein $$d = \sum_{i=0}(d_i 2^i)$$

and wherein a set P represents the ordering of indices for which $d_i$ is not equal to zero, wherein the step of identifying further comprises partitioning, for each member of the set P, $2^m$ as-yet unspecified codewords into sets of non-overlapping subdivisions, and for each of said subdivisions, determining, based upon at least one of the user bits in said portion of the sequence of user bits, whether all of the as-yet unspecified codewords in a particular subdivision proceed down respective first branches in the constellation tree, or whether exactly one of the as-yet unspecified codewords in the particular subdivision proceeds down a respective second branch in the constellation tree while the remaining as-yet unspecified codewords in the particular subdivision proceed down the respective first branches.

5. The method of claim 4 wherein the step of identifying further includes the step of determining, based upon at least another one of the user bits in said portion of the sequence of user bits, which one of the as-yet unspecified codewords in a particular subdivision proceeds down the respective second branch, if it is determined that fewer than all of the as-yet unspecified codewords in the particular subdivision proceed down the respective first branches.

6. The method of claim 5 wherein the step of specifying comprises the step of using the remaining user bits in the sequence to address entries in look-up tables wherein the look-up tables correspond to said subconstellations.

7. The method of claim 5 wherein the step of identifying comprises the step of using the sequence of user bits in the order in which they are received.

8. A method of encoding digital information at an average rate of $(n+d/2^m)$ user bits per codeword for storage on a magnetic medium, wherein n is a positive integer, and d is a positive integer less than $2^m$, the method comprising the steps of:

receiving a sequence of $(2^m n+d)$ user bits;

selecting $2^m$ dc-free codewords from among a plurality of non-intersecting subconstellations of dc-free codewords, wherein the step of selecting comprises the steps of:

identifying from which of the plurality of subconstellations each of the $2^m$ dc-free codewords will be selected based upon a portion of the sequence of user bits; and specifying the $2^m$ dc-free codewords based upon the remaining user bits in the sequence; and recording the selected $2^m$ dc-free codewords on a magnetic medium.

9. The method of claim 8 wherein the step of recording comprises the step of recording the $2^m$ dc-free codewords on digital audio tape.

10. The method of claim 9 wherein the step of recording comprises the step of recording the $2^m$ dc-free codewords on a disk drive.

11. The method of claim 8 further comprising the steps of:

reading the $2^m$ dc-free codewords recorded on the magnetic medium; and mapping the $2^m$ dc-free codewords read from the magnetic medium to the sequence of $(2^m n+d)$ user bits so as to recover the original sequence of user bits.

12. The method of claim 11 wherein the step of mapping comprises the step of using a look-up table to map each codeword to a respective portion of the sequence of user bits.

13. The method of claim 12, wherein the step of mapping further comprises the step of determining additional user bits in the sequence of user bits based upon the identity and order of the subconstellations from which the $2^m$ codewords were selected.

14. The method of claim 8 further comprising the steps of:
   reading the $2^m$ dc-free codewords recorded on the magnetic medium; and
   detecting whether an impermissible combination of codewords has been read from the magnetic medium.

15. The method of claim 14 further comprising the step of providing an alarm indicating that an impermissible combination of codewords has been read from the magnetic medium.

16. A method of generating high rate codes for encoding digital information comprising the steps of:
   receiving a signal indicating a desired average code rate of $(n+d/2^m)$ user bits per codeword, wherein n is a positive integer, and d is a positive integer less than $2^m$;
   generating a plurality of non-intersecting subconstellations of dc-free codewords, wherein the number and size of the subconstellations are determined according to the average code rate;
   assigning dc-free codewords to each of said subconstellations, wherein codewords with the most frequent bit transitions are assigned to different subconstellations from codewords with the least frequent bit transitions;
   assigning a q-bit address to each one of said dc-free codewords, where $q=\log_2 Q$, and Q is the size of the respective subconstellation to which the codeword was assigned;
   storing in memory each of said codewords, the correspondence between the codewords and the subconstellations, and the address assigned to each respective codeword;
   receiving a sequence of $(2^m n+d)$ user bits;
   selecting $2^m$ of the dc-free codewords based upon the received sequence of user bits; and
   generating a sequence of bits corresponding to the selected $2^m$ dc-free codewords.

17. The method of claim 16 wherein the step of selecting comprises the steps of:
   identifying from which of the plurality of subconstellations each of the $2^m$ dc-free codewords will be selected based upon a portion of the sequence of user bits in a predetermined order; and
   specifying the $2^m$ dc-free codewords based upon the remaining user bits in the sequence.

18. The method of claim 17 wherein the step of generating a plurality of non-intersecting subconstellations comprises the steps of:
   creating a constellation tree corresponding to the rate wherein the number of levels in the constellation tree, excluding a root node, equals the number of indices i for which $d_i$ is not equal to zero, where $$d = \sum_{i=0} (d_i 2^i),$$

wherein each node, except leaf nodes at the lowest level of the constellation tree, has a respective first and second branch, and wherein each leaf node corresponds to one of the plurality of non-intersecting subconstellations;
   labelling each respective first branch with a weight of zero;
   labelling each respective second branch in the jth level of the constellation tree with a weight (m−p(j)), where p(j) is the jth indice i for which $d_i$ is not equal to zero;
   determining the respective relative weights r(i) of each of said leaf nodes by summing the weights along each path of branches from the root node to each respective one of said leaf nodes; and
   determining the number of dc-free codewords to be assigned to each of said subconstellations according to $2^n 2^{-r(i)}$.

19. The method of claim 16 wherein the step of assigning dc-free codewords to each of said subconstellations further comprises the step of assigning codewords with the least bit transitions to the smaller subconstellations.

20. The method of claim 19 wherein the step of assigning dc-free codewords to each of said subconstellations comprises the step of assigning codewords with the most bit transitions to the larger subconstellations.

21. The method of claim 16 wherein the step of assigning dc-free codewords to each of said subconstellations comprises the step of assigning codewords having a length of N bits, where N is the smallest number such that $$\binom{N}{N/2}$$

is greater than or equal to the total number of codewords in the plurality of subconstellations.

22. A coder for encoding digital information at an average code rate of $(n+d/2^m)$ user bits per codeword, wherein n is a positive integer, and d is a positive integer less than $2^m$, the apparatus comprising:
   a memory comprising a plurality of non-intersecting subconstellations of dc-free codewords, wherein each codeword is assigned to one of the subconstellations, wherein the subconstellations are of different sizes, and wherein codewords with the least frequent bit transitions are assigned to the smaller subconstellations;
   means for selecting, in response to a received sequence of $(2^m n+d)$ user bits, $2^m$ dc-free codewords from among the plurality of subconstellations, wherein the subconstellations are used in a non-equiprobable manner such that a particular codeword from a larger subconstellation is more likely to be selected than a particular codeword from a smaller subconstellation; and
   means for generating a sequence of bits corresponding to the selected $2^m$ dc-free codewords.

23. The coder of claim 22 wherein codewords with the most frequent bit transitions are assigned to larger subconstellations.

24. The coder of claim 22 further comprising:
   means for identifying from which of the plurality of subconstellations each of the $2^m$ dc-free codewords will be selected based upon a portion of the sequence of user bits; and
   means for specifying the $2^m$ dc-free codewords based upon the remaining user bits in the sequence.

25. The apparatus of claim 24 wherein the number of subconstellations is determined by creating a constellation tree based at least upon the value of d, wherein $$d = \sum_{i=0}^{} (d_i 2^i)$$

and wherein a set P represents the ordering of indices for which $d_i$ is not equal to zero, wherein the means for identifying comprises a processor programmed to partition, for each member of the set P, $2^m$ as-yet unspecified codewords into sets of non-overlapping subdivisions, and programmed to determine, for each of said subdivisions, based upon at least one of the user bits in said portion of the sequence of user bits, whether all of the as-yet unspecified codewords in a particular subdivision proceed down respective first branches in the constellation tree, or whether exactly one of the as-yet unspecified codewords in the particular subdivision proceeds down a respective second branch in the constellation tree while the remaining as-yet unspecified codewords in the particular subdivision proceed down the respective first branches.

26. The coder of claim 22 wherein the number and size of the subconstellations stored in the memory depend upon the average code rate.

27. The coder of claim 26 wherein the memory stores a q-bit address for each of the codewords, where $q=\log_2 Q$, and Q is the size of the respective subconstellation to which the codeword was assigned.

28. The coder of claim 22 further comprising means for recording the sequence of bits corresponding to the selected $2^m$ dc-free codewords on a magnetic medium.

29. An apparatus for encoding digital information comprising:

means for receiving a signal indicating an average code rate of $(n+d/2^m)$ user bits per codeword, wherein n is a positive integer, and d is a positive integer less than $2^m$;

means for generating a plurality of non-intersecting subconstellations of dc-free codewords, wherein the subconstellations are of different sizes, and wherein the number and size of the subconstellations are determined according to the average code rate;

means for assigning dc-free codewords to each of said subconstellations, wherein codewords with the most frequent bit transitions are assigned to the larger subconstellations and codewords with the least frequent bit transitions are assigned to the smaller subconstellations;

a memory for storing said plurality of subconstellations and for storing the correspondence between said codewords and said subconstellations;

means for selecting $2^m$ of the dc-free codewords in response to a received sequence of $(2^m n+d)$ user bits; and means for generating a sequence of bits corresponding to the selected $2^m$ dc-free codewords.

30. The apparatus of claim 29 wherein the means for identifying comprises a processor programmed to execute an algorithm which uses the subconstellations in a non-equiprobable manner such that a particular codeword from a larger subconstellation is more likely to be used than a particular codeword from a smaller constellation.

31. The apparatus of claim 29 wherein the means for assigning dc-free codewords to each of said subconstellations comprises means for assigning codewords having a length of N bits, where N is the smallest number such that $$\binom{N}{N/2}$$

is greater than or equal to the total number of codewords in the plurality of subconstellations.

32. The apparatus of claim 30 wherein the means for assigning dc-free codewords to each of said subconstellations comprises means for assigning codewords with more bit transitions to larger subconstellations than codewords with fewer bit transitions.

33. An apparatus for decoding digital information recorded in a fractional bit rate format on a magnetic medium, wherein the digital information comprises $2^m$ dc-free codewords corresponding to an original sequence of $(2^m n+d)$ user bits, wherein n is a positive integer, and d is a positive integer less than $2^m$, the apparatus comprising:

means for receiving said $2^m$ dc-free codewords;

means for recovering the $(2^m n+d)$ user bits based upon the received $2^m$ dc-free codewords utilizing a mapping of the $2^m$ dc-free codewords to the sequence of $(2^m n+d)$ user bits; and means for generating a sequence of bits corresponding to the recovered user bits.

34. An apparatus for decoding digital information recorded on a magnetic medium, wherein the digital information comprises $2^m$ dc-free codewords corresponding to an original sequence of $(2^m n+d)$ user bits, wherein n is a positive integer, and d is a positive integer less than $2^m$, the apparatus comprising:

means for receiving said $2^m$ dc-free codewords;

means for recovering the $(2^m n+d)$ user bits based upon the received $2^m$ dc-free codewords;

means for generating a sequence of bits corresponding to the recovered user bits;

a look-up table storing a set of dc-free codewords, including said $2^m$ dc-free codewords, and storing respective address bits associated with each of the codewords in the set and further storing the identity of a respective one of a plurality of subconstellations to which each of the codewords in the set belongs;

means for retrieving the respective address bits associated with each of the $2^m$ dc-free codewords; and means for arranging the retrieved address bits in the order in which the corresponding $2^m$ dc-free codewords were received.

35. The apparatus of claim 34 comprising means for recovering the remaining user bits in the original sequence of user bits based upon the combination and order of subconstellations to which the $2^m$ received dc-free codewords belong.

36. The apparatus of claim 35 further comprising means for detecting whether an impermissible combination of codewords has been received.

37. The apparatus of claim 36 further comprising a circuit for providing a signal indicating that an impermissible combination of codewords has been detected.

38. A method of decoding digital information recorded in a fractional bit rate format on a magnetic medium, wherein the digital information comprises $2^m$ dc-free codewords corresponding to an original sequence of $(2^m n+d)$ user bits, wherein n is a positive integer, and d is a positive integer less than $2^m$, the method comprising the steps of:

receiving said $2^m$ dc-free codewords;

recovering the $(2^m n+d)$ user bits based upon the received $2^m$ dc-free codewords utilizing a mapping of the $2^m$ dc-free codewords to the sequence of $(2^m n+d)$ user bits; and generating a sequence of bits corresponding to the recovered user bits.

39. A method of decoding digital information recorded on a magnetic medium, wherein the digital information comprises $2^m$ dc-free codewords corresponding to an original sequence of ($2^m$n+d) user bits, wherein n is a positive integer, and d is a positive integer less than $2^m$, the method comprising the steps of:

receiving said $2^m$ dc-free codewords;

recovering the ($2^m$n+d) user bits based upon the received $2^m$ dc-free codewords wherein the step of recovering comprises:

retrieving respective address bits associating the $2^m$ dc-free codewords with the ($2^m$n+d) user bits; and arranging the retrieved address bits in the order in which the corresponding $2^m$ dc-free codewords were received; and generating a sequence of bits corresponding to the recovered user bits.

40. The method of claim 39 wherein the step of retrieving comprises retrieving said address bits from a look-up table storing a set of dc-free codewords, including said $2^m$ dc-free codewords, and storing said respective address bits associated with each of the codewords in the set and further storing the identity of a respective one of a plurality of subconstellations to which each of the codewords in the set belongs.

41. The method of claim 40 wherein the step of recovering further comprises the step of recovering the remaining user bits in the original sequence of user bits based upon the combination and order of subconstellations to which the $2^m$ received dc-free codewords belong.

42. The method of claim 41 further comprising the step of detecting whether an impermissible combination of codewords has been received.

43. The method of claim 42 further comprising the step of providing a signal indicating that an impermissible combination of codewords has been detected.

* * * * *